United States Patent
Gershenfeld et al.

[11] Patent Number: 6,051,981
[45] Date of Patent: *Apr. 18, 2000

[54] METHOD AND APPARATUS FOR CHARACTERIZING MOVEMENT OF A MASS WITHIN A DEFINED SPACE

[75] Inventors: Neil Gershenfeld, Somerville; Joshua R. Smith, Cambridge, both of Mass.

[73] Assignee: Massachusetts Institute of Technology, Cambridge, Mass.

[*] Notice: This patent is subject to a terminal disclaimer.

[21] Appl. No.: 09/201,336

[22] Filed: Nov. 30, 1998

Related U.S. Application Data

[60] Continuation of application No. 08/831,196, Apr. 2, 1997, Pat. No. 5,914,610, which is a division of application No. 08/606,540, Feb. 23, 1996, abandoned, which is a continuation-in-part of application No. 08/191,042, Feb. 3, 1994, abandoned.

[51] Int. Cl.[7] .................................................. G01R 27/26
[52] U.S. Cl. ......................... 324/663; 324/452; 324/678; 324/687
[58] Field of Search ..................................... 324/663, 725, 324/690, 661, 662, 687, 688, 452, 457, 658, 671, 676, 678

[56] References Cited

U.S. PATENT DOCUMENTS

| | | | |
|---|---|---|---|
| 3,774,238 | 11/1973 | Hardway | 324/663 |
| 3,781,672 | 12/1973 | Maltby | 324/61 |
| 3,843,924 | 10/1974 | Wahlgreen | 324/61 |
| 4,016,490 | 4/1977 | Weckenmann et al. | 324/672 |
| 5,130,672 | 7/1992 | Watkiss | 331/65 |
| 5,134,379 | 7/1992 | Maher | 324/663 |
| 5,189,377 | 2/1993 | Rhoades | 324/662 |
| 5,258,443 | 11/1993 | Howing | 307/9.1 |
| 5,418,468 | 5/1995 | Baker | 324/674 |
| 5,436,613 | 7/1995 | Ghosh et al. | 340/573.1 |
| 5,730,165 | 3/1998 | Philipp | 324/678 X |
| 5,844,415 | 12/1998 | Gershenfeld et al. | 324/663 |
| 5,914,610 | 6/1999 | Gershenfeld et al. | 324/663 |
| 5,936,412 | 8/1999 | Gershenfeld et al. | 324/663 |

*Primary Examiner*—Glenn W. Brown
*Attorney, Agent, or Firm*—Cesari and McKenna, LLP

[57] ABSTRACT

Apparatus and methods for resolving movement of a mass within a defined space utilizes at least one electrode proximate to the space to be observed. An AC signal is applied to the electrode, and the current measured from that electrode and also to any other electrodes included in the system and which are effectively connected to the ground return of the AC-coupled electrode. A person (or object) to be sensed intercepts a part of the electric field extending beween the AC-coupled "sending" electrode and the other "receiving" electrodes, the amount of the field intercepted depending on the size and orientation of the sensed person, whether or not the person provides a grounding path, and the geometry of the distributed electrodes. Given the nonlinear spatial dependence of the field, multiple electrodes can reliably distinguish among a set of expected cases. The invention detects motion by taking sequential measurements at different times and utilizing the time variation in signal magnitudes as well as the absolute magnitudes themselves.

13 Claims, 8 Drawing Sheets

METHOD AND APPARATUS FOR CHARACTERIZING MOVEMENT OF A MASS WITHIN A DEFINED SPACE

RELATED APPLICATIONS

This is a continuation of U.S. Ser. No. 08/831,196, filed Apr. 2, 1997, now U.S. Pat. No. 5,914,610, which is itself a division of U.S. Ser. No. 08/606,540, filed Feb. 23, 1996, now abandoned, which is itself a continuation-in-part of U.S. Ser. No. 08/191,042, filed Feb. 3, 1994, now abandoned.

FIELD OF THE INVENTION

The present invention relates generally to the sensing of position and the distribution of mass within a spatial reference frame, and in particular to a sensing system that resolves the presence, orientation and salient characteristics of a person in a defined space based on variations in a displacement current.

BACKGROUND OF THE INVENTION

Determining the position, orientation or mere presence of a person within a defined space is important in applications ranging from medical treatment to safety and security. For example, prior to initiating operation of a tomographic scanning device, it is essential to ensure that the patient is not only within the device, but also oriented properly with respect to the scanning elements. While direct visual monitoring by trained personnel is obviously ideal, the nature of the equipment may make this impossible.

Of even greater concern are devices that operate automatically but rely on an assumption of proper orientation. For example, airbags are now employed as standard equipment on new automobiles, and have substantially reduced accident-related injury by cushioning the driver and passenger. However, because of their explosive deployment, airbags can themselves cause injury or even death of an infant improperly oriented in the passenger seat. They are also expensive to repack, so that passenger-side deployment into an empty seat is wasteful. Thus, although visual monitoring is simple and unimpeded in an automobile, it is not necessarily reliable; consumers may be unaware of proper airbag operation, and the routine character of operating an automobile invites inattentiveness: a driver might easily fail to disable the airbag after his passenger departs, or may orient a child improperly.

For such applications, where proper orientation is critical but difficult to monitor visually with adequate reliability, sensor arrays have been developed to obviate the need for human attention. These arrays typically contain a large number of sensing devices arranged to surround the space of interest; the sensors are often utilized in a binary fashion—detecting or not detecting presence within an operating range—so that numerous devices typically are necessary to resolve the different orientations of interest with a tolerable level of ambiguity. But the number of sensors is not chosen in any systematic or rigorous fashion; there is no methodology for minimizing the number of sensors, nor any test (other than experimentation) to ensure that the number chosen will resolve all necessary cases.

In order to ensure reliability, current systems may also require multiple sensing modalities (e.g., some combination of infrared, ultrasound, force and capacitance sensing). Once again, the reason for this stems from a "brute force" approach to distinguishing ambiguous cases.

For example, a common type of binary electrostatic sensor is a capacitive button switch, which is activated when the user places a finger thereon; in so doing, the user effectively increases the capacitance of a capacitor, with the resulting increase in capacitive current indicating actuation of the button. A more advanced version of this type of sensor is described in published PCT application WO 90/16045 (Tait), which describes an array of receiver electrodes arranged about a central transmitting electrode. Even this type of configuration, however, is only slightly more advanced than a purely binary system, since what is measured is variation in weighting among the arrayed electrodes. Arrangements such as this do not meaningfully reduce the number of devices (i.e., electrodes) necessary to characterize position and orientation, nor provide an approach to obtaining an optimum number of devices. Moreover, the Tait device is not employed in a manner that is even capable of resolving a three-dimensional mass distribution, much less distinguishing among different orientation/position cases. It is expected that contact will be complete in all cases—that is, the user's finger will actually touch the transmitting and receiving electrodes—rendering the approach unsuitable where such contact is not possible.

DESCRIPTION OF THE INVENTION

Brief Summary of the Invention

The present invention dispenses entirely with the need for contact between the person under observation and the sensor, and substantially reduces the number of necessary sensing devices by multiplying the functions that each performs.

In accordance with the invention, a set of electrodes is arranged about the space to be observed. An AC signal is applied to a first of these electrodes, and measurements taken of the current exiting that electrode and also the currents into all of the other electrodes, which are effectively connected to the ground return of the AC-coupled electrode. A person (or object) to be sensed intercepts a part of the electric field extending beween the AC-coupled "sending" electrode and the other "receiving" electrodes, the amount of the field intercepted depending on the size and orientation of the sensed person, whether or not the person provides a grounding path, and the geometry of the distributed electrodes.

For example, in a simple case, such as that contemplated in the Tait application, a person is so close to a sending/receiving electrode pair that she effectively bridges the electrodes, increasing their capacitive coupling and, therefore, the current through the receiving electrode as compared with the current that would flow in the person's absence. If, however, the person is standing on the ground and is somewhat distant from the electrodes, her body provides a grounding path in addition to increasing the capacitive coupling. These two effects are opposed: the path to ground diverts some of the current, reducing the output at the receiving electrode, while enhanced capacitive coupling increases output current. (The grounding path is insignificant in the simple case where the person touches both electrodes, since the capacitive-coupling effect predominates.)

Also relevant is the absolute amount of current through the person, regardless of whether it reaches a receiving electrode or is shunted to ground. Indeed, if the person is close to the sending electrode but distant from the receiving electrodes, this will be the only relevant parameter.

All of these measurements, in combination with knowledge of electrode geometry, help to resolve the position and orientation of the person within the space. Because the response of the field to mass distribution is a complex nonlinear function, adding electrodes can always distinguish among more cases. In other words, each electrode represents an independent weighting of the mass within the field; adding an electrode provides information regarding that mass that is not redundant to the information provided by the other electrodes.

Yet perfect resolution is frequently unnecessary as a practical matter. The present invention is primarily intended not to fully resolve position and orientation, but to distinguish among a discrete set of allowed characteristics, positions and orientations. The geometry and number of electrodes are chosen so as to be capable of distinguishing among these allowed possibilities with a desired degree of reliability.

To increase this reliability—that is, to reduce ambiguity—the invention preferably includes means for switchably designating each electrode as either a transmitting or a receiving electrode. Making a set of measurements with the source and receivers located at different positions substantially increases the resolution capability of the system without increasing the number of sensors.

The invention also comprises a search methodology wherein sets of measurements are represented as points in a multidimensional "measurement space"; with proper electrode orientation and a sufficient number of measurements in each set (i.e., a sufficient number of spatial dimensions), the spatial regions occupied by measurements taken at different ones of the allowed positions and orientations will be discrete and separable. In other words, despite some variation in position and orientation within an allowed state, as well as in extraneous variables such as a person's mass, measurements will still tend to cluster in spatial regions characteristic of the allowed states.

By maintaining a pattern characterizing the cluster regions and their extents (generated, for example, by measuring different individuals in the various allowed states), a new measurement can be unambiguously associated with a cluster region and, therefore, a single one of the allowed states can be inferred.

The invention is usefully employed in any application where distinguishing among various positions and/or orientations, or the presence or absence of an occupant, is important. Representative applications include airbag-deployment control systems; systems used to control electrical devices (e.g., a reading chair with a lamp that turns on or brightens when a person is seated, or an office chair that actuates a desktop computer when the chair becomes occupied); alert systems (e.g., a seat for airplane pilots, automobile drivers and truck drivers that issues an alert signal when the operator's head droops); intermittently active advertising systems (e.g., a multimedia kiosk or video-arcade game that senses passersby and signals them to attract their attention); and appliances or toys that "know" when they are being held.

The invention can be configured to detect not only static positions and orientations, but also motion through a defined space. This is accomplished by taking sequential measurements at different times and measuring differences (if any) in the time-shifted signal magnitudes as well as the absolute magnitudes themselves. In effect, time becomes another measurement parameter, in the same way that adding an electrode provides a further spatial measurement parameter.

BRIEF DESCRIPTION OF THE DRAWINGS

The foregoing discussion will be understood more readily from the following detailed description of the invention, when taken in conjunction with the accompanying drawings, in which.

DETAILED DESCRIPTION OF THE PREFERRED EMBODIMENTS

Figure 1A:
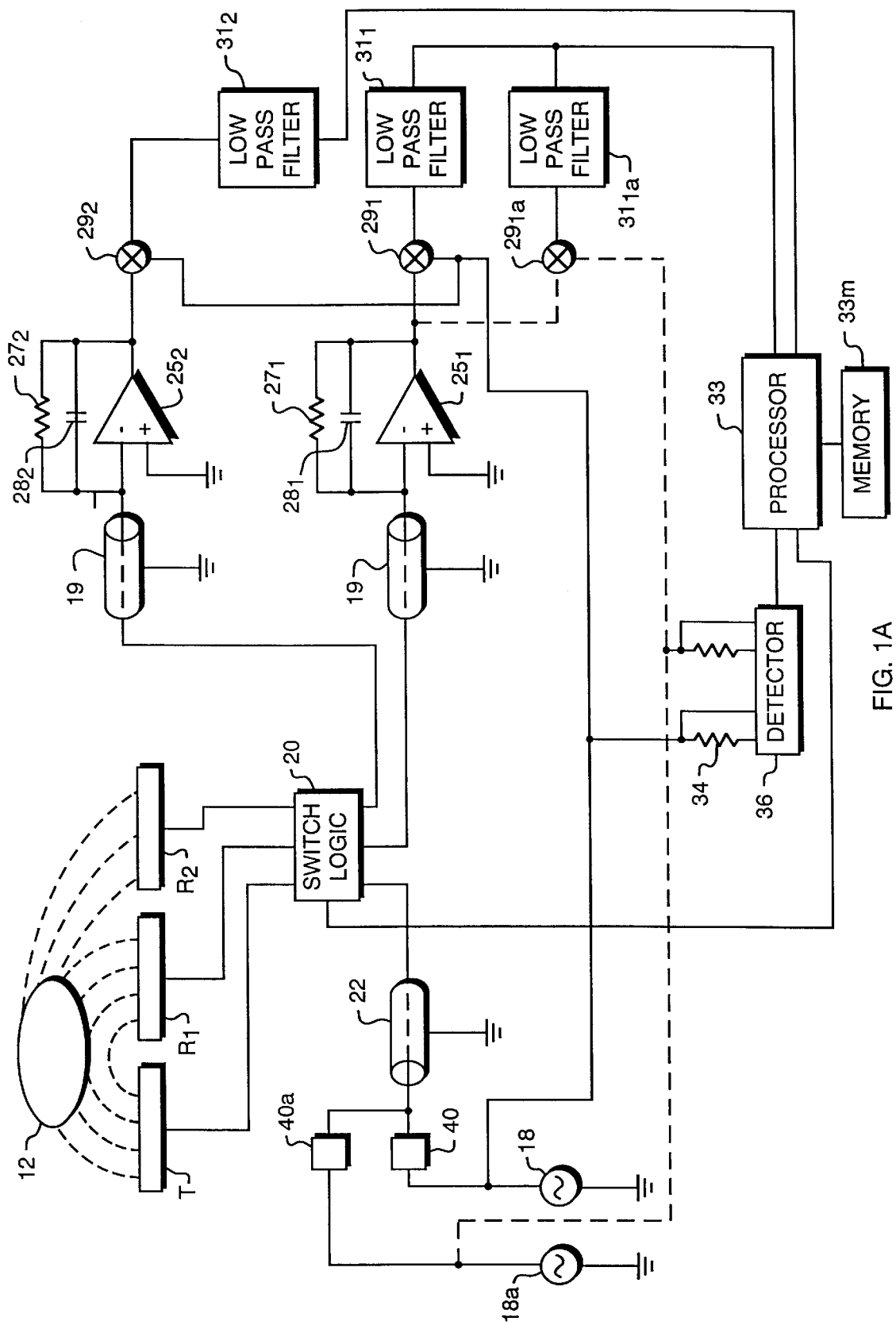
FIG. 1A is a schematic diagram of a sensor incorporating the invention.

Refer first to FIG. 1A, which illustrates a multi-electrode circuit suitable for practice of the present invention. The circuit is arranged to sense a characteristic of a mass 12 by detecting changes in the electric field involving three electrodes variously employed as receiving and transmitting electrodes as described below, it being understood that the number of electrodes actually employed in a given implementation depends on the nature of the application. In the representative mode of operation shown in the figure, the electrodes include a sending or transmitting electrode T and a pair of receiving electrodes $R_1$, $R_2$. The object 12 may be, for example, a human body or portion thereof; the characteristic to be sensed depends on the relative positions of the three electrodes (with respect to each other and to object 12), and the manner in which they are used.

The circuit includes components defining a transmitter stage, switchably coupled to transmitting electrode T, and a pair of receiver stages switchably coupled to receiving electrodes $R_1$, $R_2$. The transmission stage includes an alternating-current (AC) source 18 connected, by means of a switching logic circuit 20, between the electrode T and a reference point, i.e., ground, with a shielded cable 22 being used for the connections between source 18 and electrode T. Electrodes $R_1$, $R_2$ are also connected to the output side of switch logic 20 (by means of shielded cable 19), and the other two inputs to switch logic 20 originate with a pair of receiver stages switchably connected to electrodes $R_1$, $R_2$. Each receiver stage includes an operational amplifier $25_1$, $25_2$ connected in a negative feedback circuit. Thus, each of the two receiver input terminals is connected to the inverting input terminal of one of the amplifiers $25_1$, $25_2$. The non-inverting input terminals are thus essentially at ground potential and the output voltage of each of the amplifiers corresponds to the current from electrode T to ground.

A resistor $27_1$, $27_2$ and a capacitor $28_1$, $28_2$ bridge the inverting input terminal and the output terminal of each amplifier $25_1$, $25_2$, which are, in turn, each connected to a synchronous detector $29_1$, $29_2$, whose other input is a signal from source 18. Accordingly, the output of the detectors $29_1$, $29_2$ is the component in the output of amplifier $25_1$, $25_2$ that has the frequency and phase of the source 18. It is thus free of interfering signals and noise that may be picked up by the electrodes $R_1$, $R_2$.

The receiving stages each also include a low pass filter $31_1$, $31_2$ which smooth the output of detectors $29_1$, $29_2$. The signals from filters $31_1$, $31_2$ are applied to a computer processor 33, which includes an analog-to-digital converter (not shown) that converts the voltage from the filter to a digital value. The computer 33 controls switch logic 20, and utilizes the signals from filters $31_1$, $31_2$, as described below.

A resistor 34 is connected between the output of source 18 and one input terminal of a voltage detector 36, the other input terminal being connected directly to the output of source 18. In this way, detector 36 can be calibrated to measure the current output of source 18, and its output is provided to computer 33.

The frequency $f_1$ of source 18 may be 100 kHz, and the relative spacing of the electrodes depends on the characteristics being sensed. In any case, the length of the electrodes and the spacing between them are substantially less than a wavelength at the frequency $f_1$. Accordingly, there is minimal radiation from electrode T and the coupling to electrodes $R_1$, $R_2$ is (essentially capacitive.

Figure 1B:
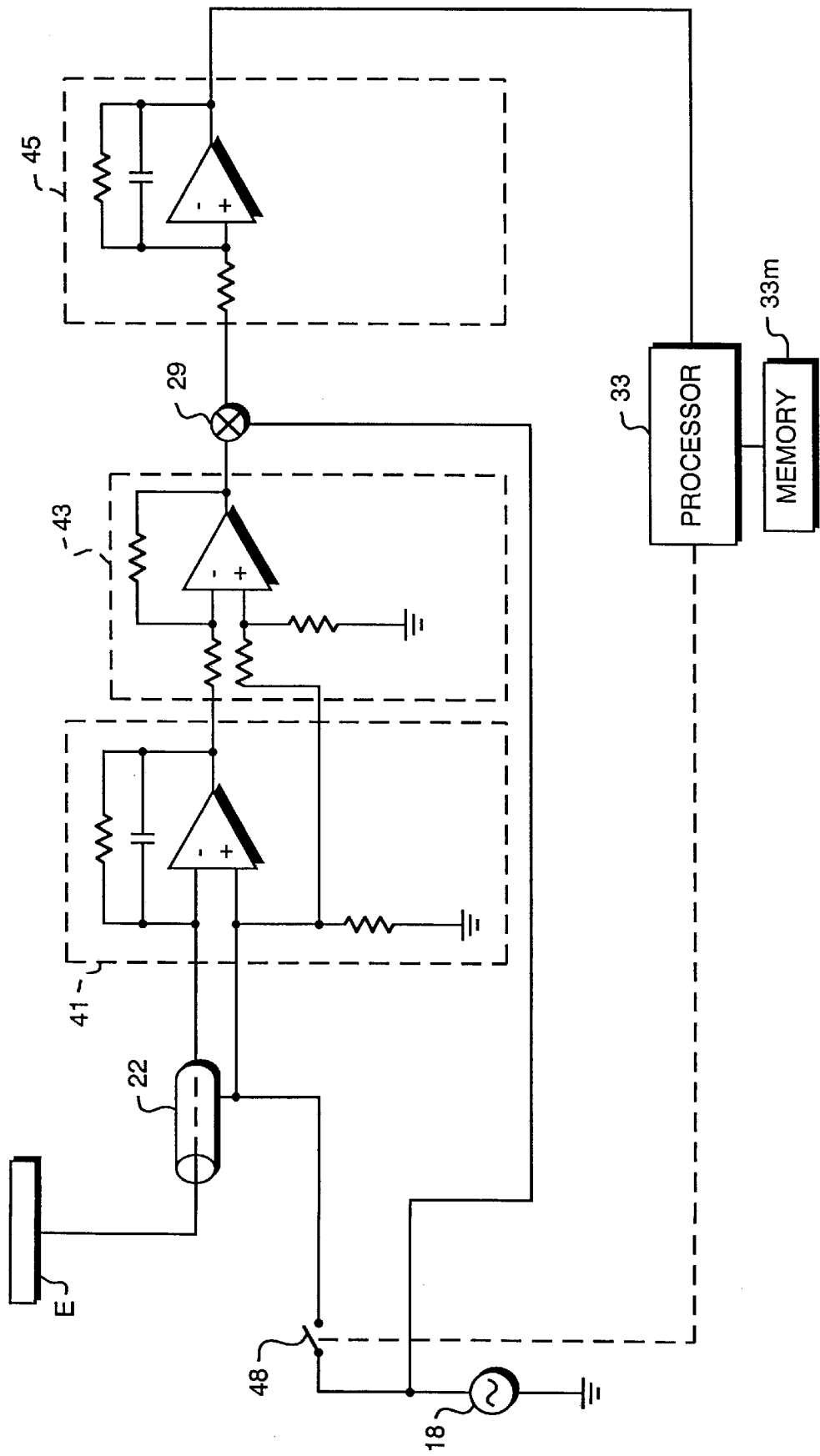
FIG. 1B is a schematic diagram of an alternative sensor design that can be employed as a receiver or a transmitter.

FIG. 1B illustrates an alternative arrangement that avoids the need for switch logic and separate receiver and transmitter stages. The circuit includes an electrode E, which can be a transmitting or receiving electrode; an AC source 18; a transimpedance amplifier 41 measuring current; a differential amplifier 43; a synchronous detector 29 whose input terminals are connected to the output of amplifier stage 43 and source 18; and a low-pass filter stage 45. A switch 48, controlled by computer 33, determines whether electrode E is a transmitting or receiving electrode.

In operation, closing switch 48 applies the signal from AC source 18 to electrode E (via feedback) causing the circuit to operate as a transmitter. The input to the second gain stage 43 is a voltage proportional to the current into electrode E, so the ultimate signal reaching computer 33 reflects a loading measurement.

Figure 2:
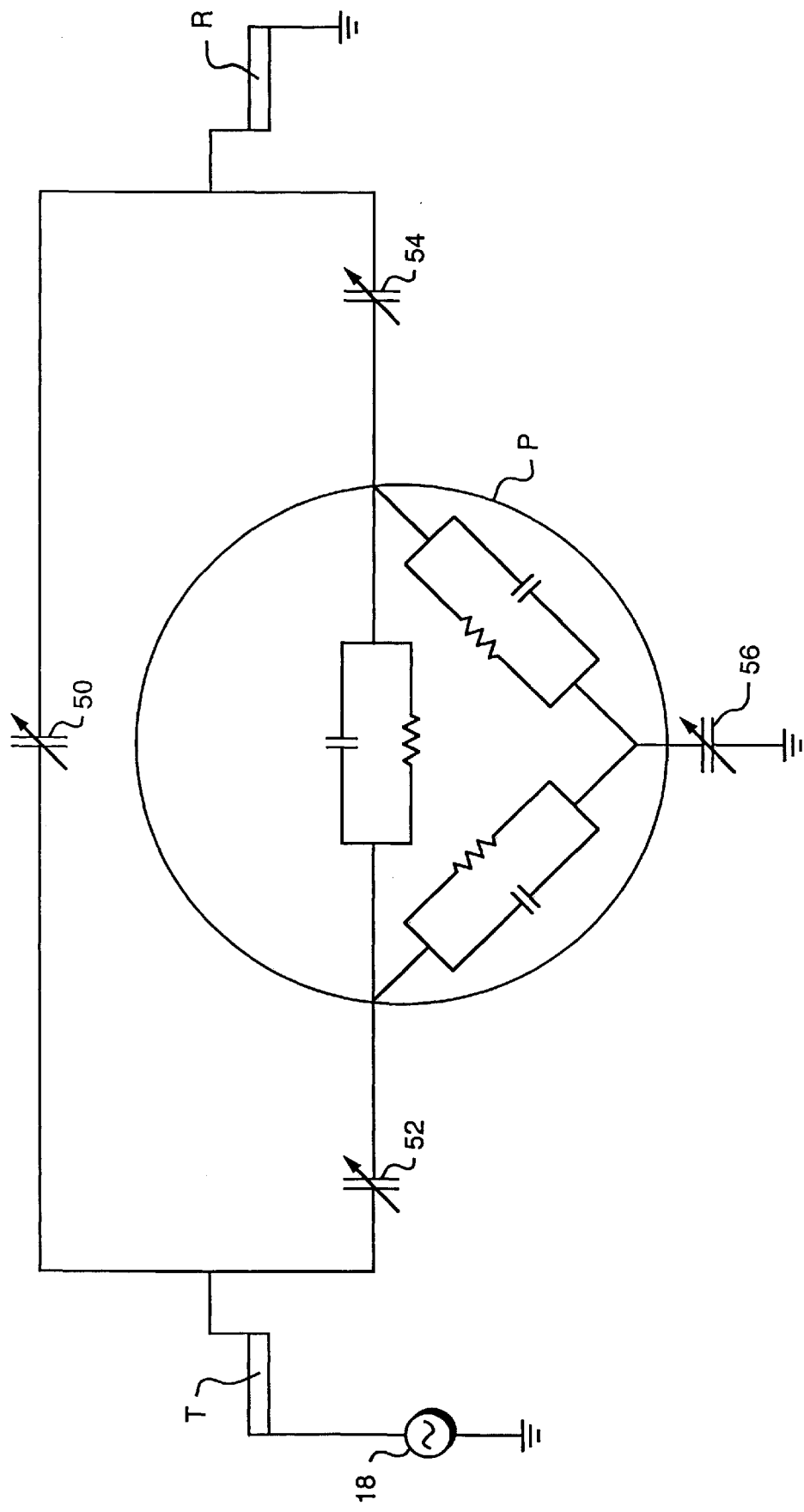
FIG. 2 illustrates the manner in which a sensed object or person affects the parameters measured by the invention.

Opening switch 48 decouples electrode E (but not detector 29) from AC source 18, so the signal into electrode E, which the other circuit components amplify and filter, originates externally (i.e., with a similar circuit behaving as a transmitter). The introduction of a person (or a person's limb or feature) into the electric field extending between, e.g., electrode T and electrodes $R_1$, $R_2$ may be understood with reference to FIG. 2, which models the various interactions in terms of an equivalent, hypothetical circuit. In the figure, the person P is represented as a three-terminal network, and current from AC source 18 (transmitted through a transmitting electrode T) can reach ground via any of three current paths: through a first variable capacitor 50 connected to a receiving electrode R (spaced some distance from electrode T and connected to ground); through a pair of variable capacitors 52, 54 on either side of network P and then to electrode R; or directly through network P and a fourth variable capacitor 56. The values of the various hypothetical capacitors in the circuit depends on the relative distances between the electrodes R, T and the person P, and the circuit assumes that person P is positioned within the space defined by the electrodes.

The capacitor 50 represents capacitive coupling solely between the electrodes, as if they were the two plates of a single capacitor. Without the person P, this capacitance would predominate; when introduced, however, person P, who is electrically conductive, "steals" flux from the electric field between the two electrodes and conducts it to ground via capacitor 56, but also increases the capacitive coupling between the electrodes by changing both the effective geometry and the dielectric constant; this increase in capacitive coupling is represented by the capacitors 52, 54.

In "loading" mode, current into receiver electrode R is inconsequential or ignored for measurement purposes; the only relevant current is that exiting electrode T, regardless of how it reaches ground. For example, if electrode R is very far from both electrode T and person P, which are proximate to one another, the dominant capacitances will be those at 52, 56, and the current exiting T—as measured, in FIG. 1A, by detector 36—will essentially equal the current through person P.

If, however, the electrodes are spaced more closely, the electric field between them is stronger, and the other capacitances become more significant; their relative significances, of course, depend on the length scale and position of person P with respect to the electrodes. If person P is very close to electrode T, the person's body is effectively clamped to the AC source, so it oscillates at the transmission voltage. In this "transmit" mode, capacitance 52 is therefore very large relative to capacitances 54, 56. Because AC source 18 is configured to deliver a constant voltage, the increase in capacitance 52 as person P approaches electrode T forces AC source 18 to put out more current (which can be detected by a "loading mode" measurement) in order to maintain the constant voltage. This results in greater current at electrode R, the amount of the increase depending on the ratio of capacitance 56 to capacitance 54 (the magnitude of capacitance 54, in turn, depending on the distance between the person P and electrode R).

When there is some distance between person P and both electrodes, capacitance 56 is overwhelmed neither by capacitance 52 nor capacitance 54, and therefore contributes to the current detected. In this "shunt" mode, some of the field is shunted to ground, and the effect of capacitance 56 is to reduce the current at electrode R. The shunted current is maximized when the person is situated halfway between electrodes T and R, since capacitances 52, 54 are thereby minimized (and capacitance 56 is assumed not to vary significantly with position); if the person P moves closer to either electrode, one of capacitances 52 and 54 will increase and the other will decrease, but the net effect is greater current into electrode R. Naturally, the shunting effect is increased to the extent person P's coupling to ground is improved (the limiting case occurring, for example, when person P touches a grounded wire).

These three cases represent the most extreme situations that may be encountered, and are therefore most easily interpreted in terms of signal measurements. For example, a high current out of electrode T and virtually no current into electrode R unambiguously locates person P proximate to or touching electrode T and far from electrode R. But most cases are intermediate, resulting in degeneracy. That is, the signal values cannot unambiguously characterize the location and orientation of person P, because those values can be produced by more than one unique location and orientation.

Rather than attempt to resolve degeneracies by increasing the number of electrodes, the present invention increases the number of measurements. By selectively connecting the AC source 18 to different ones of a set of electrodes, and measuring the current exiting the AC-coupled electrode and into the other electrodes, a matrix of measurements can be obtained. If each of n electrodes is employed as a transmitting electrode with current readings taken both from the transmitting and other electrodes, the matrix is square $$\begin{bmatrix} m_{11} & m_{21} & \cdots \\ m_{12} & \ddots & \\ \vdots & & \\ & & m_{ij} \end{bmatrix}$$

for i=j=n electrodes. The diagonal terms $m_{11} \ldots m_{ij}$ refer to measurements made in loading mode, i.e., the current out of the transmitting electrode; the entry $m_{21}$ refers to the current into electrode 2 when electrode 1 is the transmitter; and the entry $m_{12}$ refers to the current into electrode 1 when electrode 2 is the transmitter.

Even if this measurement matrix is insufficient to fully characterize the location and orientation of person P, it can still be used to place the person within a defined range of possible locations and orientations based on known, characteristic measurement patterns. For example, suppose the person is constrained to a fixed number of orientations within the measured field. While different people in slight variations of the allowed orientations will produce different measurement patterns, these patterns will still tend to cluster. So long as the different clusters can be mathematically resolved and are distinct from one another—that is, the electrode arrangement is judiciously chosen to avoid measurement degeneracy among allowed orientations—new measurements can broadly be said to belong to one of the clusters and an orientation among the allowed orientations thereby assigned.

To characterize these clusters, one can, for n electrodes, define a measurement space of $n^2$ dimensions, with each matrix of measurements for a particular person in a given orientation constituting a single point in this space. It is these points that will tend to cluster within a given spatial region for each allowed orientation, and so long as the cluster regions are separable (i.e., classifiable by decision boundaries in the measurement space), it will be possible to unambiguously infer orientation by locating the cluster to which a new measurement belongs.

Importantly, because each additional electrode represents a weighting of the mass in the field that is independent (due to the nonlinearity of the response of the field to mass distribution), n electrodes provides enough information to distinguish among roughly $n^2$ different cases (the $n^2$ figure being limited only by symmetry and insufficient measurement variation among the different cases to permit their reliable resolution). Thus, adding even one electrode substantially increases the number of cases that can be resolved. As a practical matter, this means that an initial configuration capable of distinguishing among many cases and failing only for a few can usually be extended to resolve the ambiguous cases through addition of a single electrode.

The manner in which the invention is practiced may be understood with renewed reference to FIGS. 1A and 1B. Computer 33 is associated with a memory 33m that stores both data and executable programming instructions. In the simplest approach, these instructions cause computer 33 to operate switch logic 20 so as to couple AC source 18 sequentially to the three illustrated electrodes. Each time source 18 is so coupled, computer 33 reads signals from filters 31$_1$, 31$_2$ and from detector 36, thereby making a row of measurements, and stores these in memory 33m. Memory 33m also includes pattern information concerning cluster locations in $n^2$ space. This information can consist simply of large numbers of previous measurements which, when represented as points in $n^2$ space, naturally cluster in characteristic regions. Preferably, however, it includes a more precise mathematical characterization (e.g., in the form of templates) of the cluster patterns and their boundaries, which thereby serve as decision boundaries. These boundaries are determined using linear or nonlinear clustering algorithms well known to those of skill in the art. So long as the boundaries are discrete and separable, assessing the location in $n^2$-space of a new $n^2$-dimensional measurement most likely places it within a boundary, unambiguously designating the characteristics associated with that bounded region; or places it outside a boundary, indicating that the characteristics do not match any of the known (or allowed) cases upon which the boundaries are based.

Obviously, memory 33m may be configured to include permanent storage containing several different cluster patterns corresponding to different allowed orientation sets or electrode arrangements, with computer 33 including a suitable user interface to facilitate selection thereamong.

Depending on the cluster distribution, it may not be necessary to complete the full matrix of measurements in order to characterize presence or orientation. The system can be designed along a hierarchy, proceeding only as far as is necessary to characterize the parameter of interest. As a trivial example, a single loading-mode measurement may be sufficient to resolve presence; more generally, the following measurement hierarchy is useful in the design of a variety of implementations:

1. Loading-mode measurement with a single electrode;
2. Two electrodes, one a fixed transmitter, the other a fixed receiver;
3. Two electrodes each switchably operable as a transmitter or a receiver, facilitating a full 2×2 measurement matrix;
4. Add further electrodes and measurements according to guidelines 1–3.

As is obvious from the measurement matrix, the different measurement modes are not mutually exclusive; instead, they each contribute different information toward characterizing the mass and distinguishing among cases. For example, "loading mode" measurements are by no means useful only where current into receiving electrodes is negligible; instead, they are utilized in conjunction with other measurements that are by themselves inadequate; each measurement contributes independent, non-redundant information. (For ease of presentation, the terms "shunt mode" and "transmit mode" are sometimes used herein to designate the dominant mode of a particular measurement, rather than in an exclusive sense.)

Another strategy for resolving degeneracy is the use of multiple transmission frequencies, since the output voltage of the sensor 10 is a function of the frequency $f_1$ of source 18 in addition to the configuration and spacing of the various electrodes and the orientation of the person with respect thereto. Multiple AC sources, each operating at a characteristic frequency, can simultaneously operate through a single transmitting electrode; or, instead, each of the electrodes, when used as a transmitting electrode, can be energized at one or more frequencies different from those at which the other electrodes operate.

Thus, again with reference to FIG. 1A, the electrode T can be connected to receive signals from both the source 18 and a second source 18$_a$ having a frequency $f_2$. The sources 18 and $18_a$ are coupled to the receiving electrodes $R_1$, $R_2$ through isolation filters 40 and $40_a$, tuned to the frequencies $f_1$ and $f_2$, respectively. The output of the amplifier 20 is applied to a second synchronous demodulator $29_{1a}$ connected to the source $18_a$. The output of the demodulator $22_{1a}$ is passed through a low-pass filter $24_{1a}$, whose output in turn is fed to the processor 33. Since the output currents from the electrodes $R_1$, $R_2$ are, in part, a function of frequency, the use of multiple frequency sources provides, in essence, multiple sending and receiving electrodes sharing common physical electrodes.

A highly advantageous application of the present invention is detection of presence and orientation in automobile seats designed for infants and small children. The need for this type of measurement has taken on special urgency with the introduction into automobiles of airbag safety devices, which inflate explosively upon the automobile's impact. If the child seat is installed in the front passenger side of the automobile, it is critical to the safety of the infant that the seat 90 face backward, as shown in FIG. 3B, opposing the back rest 77 of the automobile seat 79; in this way, should the automobile decelerate rapidly, the infant's head will be supported by the upright portion of the seat and not snap forward. However, the infant's head is then in dangerously close proximity to the explosive airbag. In this orientation, the airbag must be disabled.

Figure 3A:
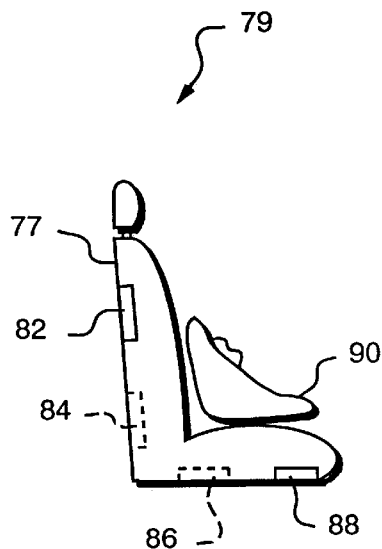
FIGS. 3A and 3B are elevational, partially schematic views of an application of the invention involving airbag deployment.
Figure 3B:
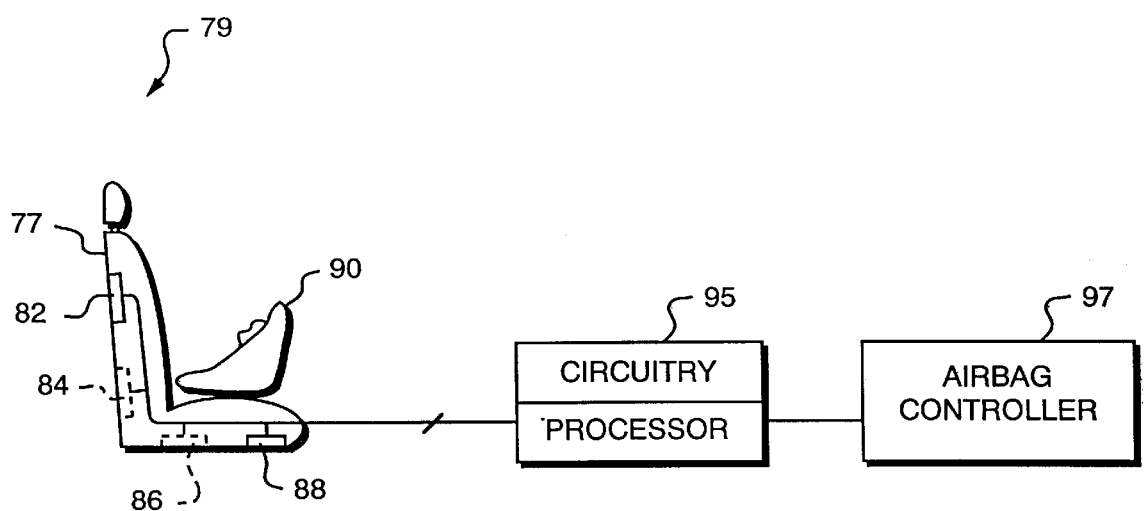

If, on the other hand, the child seat 90 is oriented forward, toward the windshield as shown in FIG. 3A, the explosive deployment of the airbag is not a threat because the seat retains the infant an adequate distance from the airbag.

At the same time, replacement and repackaging of the airbag following deployment entails considerable expense. Accordingly, the airbag should deploy only if the passenger seat is occupied, and if occupied by an infant, only if the child seat is oriented such that the infant faces forward.

All of the relevant possibilities can be resolved using four electrodes 82, 84, 86, 88 as shown in FIGS. 3A and 3B; in fact, for this application reliable results can be obtained with only three electrodes, as discussed further below, so that either of electrodes 84, 86 (both shown in phantom) can be omitted from the design. As shown in FIG. 3B, the electrodes are connected to the circuitry and processor arrangement shown in FIG. 1A or 1B (and indicated generically at 95);

the processor, in turn, is connected to a circuit 97 that controls operation of the automobile airbag.

Refer now to FIGS. 4A–4E, which descriptively illustrate the effects of various cases on the 3×3 measurement matrix obtainable with three electrodes generically labeled $E_1$, $E_2$, $E_3$ that may be switchably employed as transmitting or receiving electrodes in accordance with FIGS. 1A and 1B. The coarsest relevant measurement is whether the seat is occupied by a person at all. This measurement is not trivial, since the driver may load groceries or other items onto the seat, and any useful sensor array must be capable of distinguishing persons from inanimate objects. Although food or merchandise tend to exhibit conductivities different from that of a person (plastic and glass-packaged items will tend to be poor conductors, for example, while metal items conduct much better), the average or aggregate conductivity may not differ significantly. On the other hand, the conductivity distribution probably will not match that of a person, so that a full matrix of measurements will easily distinguish person from object.

Figure 4A:
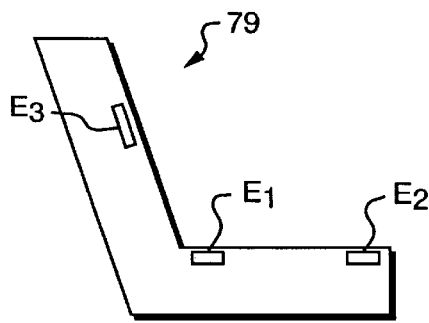
FIGS. 4A–4E schematically depict the measurement patterns corresponding to various different cases involving an automobile seat.

Thus, in FIG. 4A, seat 77 is empty. Table $100_a$ represents the measurement matrix, with the height of each tabular entry graphically depicting the amount of current into a receiving electrode. The sensors have all been calibrated so that all current levels are the same and scaled to the halfway point.

Figure 4B:
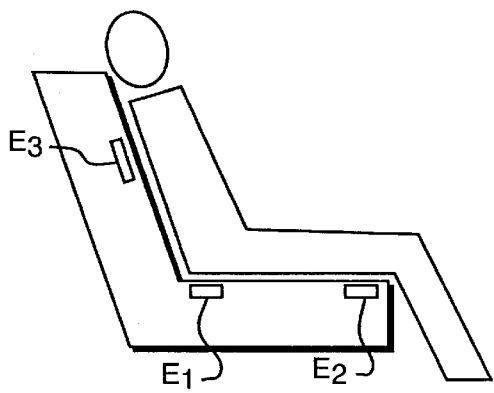

By contrast, because an adult spans all three electrodes, as shown in FIG. 4B, transmission-mode coupling is characteristically large and relatively uniform through the measurement matrix as illustrated in table $100_b$. The effect is similar but diminished in the case of a forward-facing infant, as shown in FIG. 4D. Transmission-mode coupling between all electrodes, while substantial and uniform, is not as large as in the case of the adult.

Figure 4C:
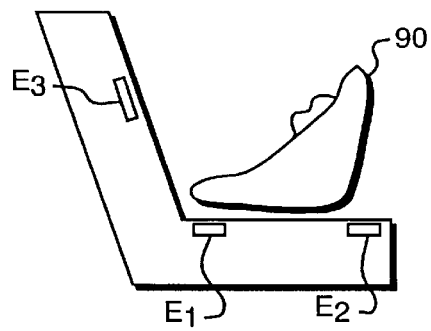
Figure 4D:
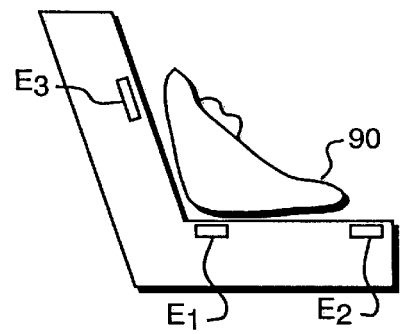

In the case of a rearwardly oriented infant, as shown in FIG. 4C, transmission-mode coupling between electrodes $E_3$ and the other two electrodes is quite small, while coupling between electrodes $E_1$ and $E_2$ is similar to that produced by a forward-facing infant.

Figure 4E:
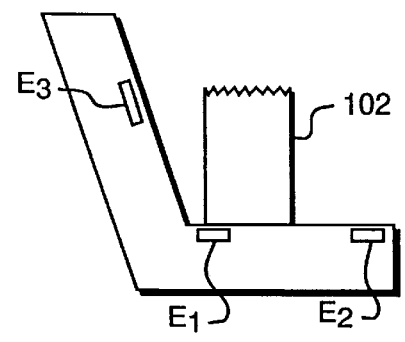

The measurement pattern produced by an object such as a bag of groceries, as shown in FIG. 4E, is easily distinguished from the others. It is explained by the fact that when the electrode beneath the groceries (i.e., electrode $E_1$) is the transmitter, it puts out a relatively large current, resulting in large loading-mode and transmit-mode readings; when either of the other electrodes transmits, the effect of the groceries is insubstantial.

Figure 5:
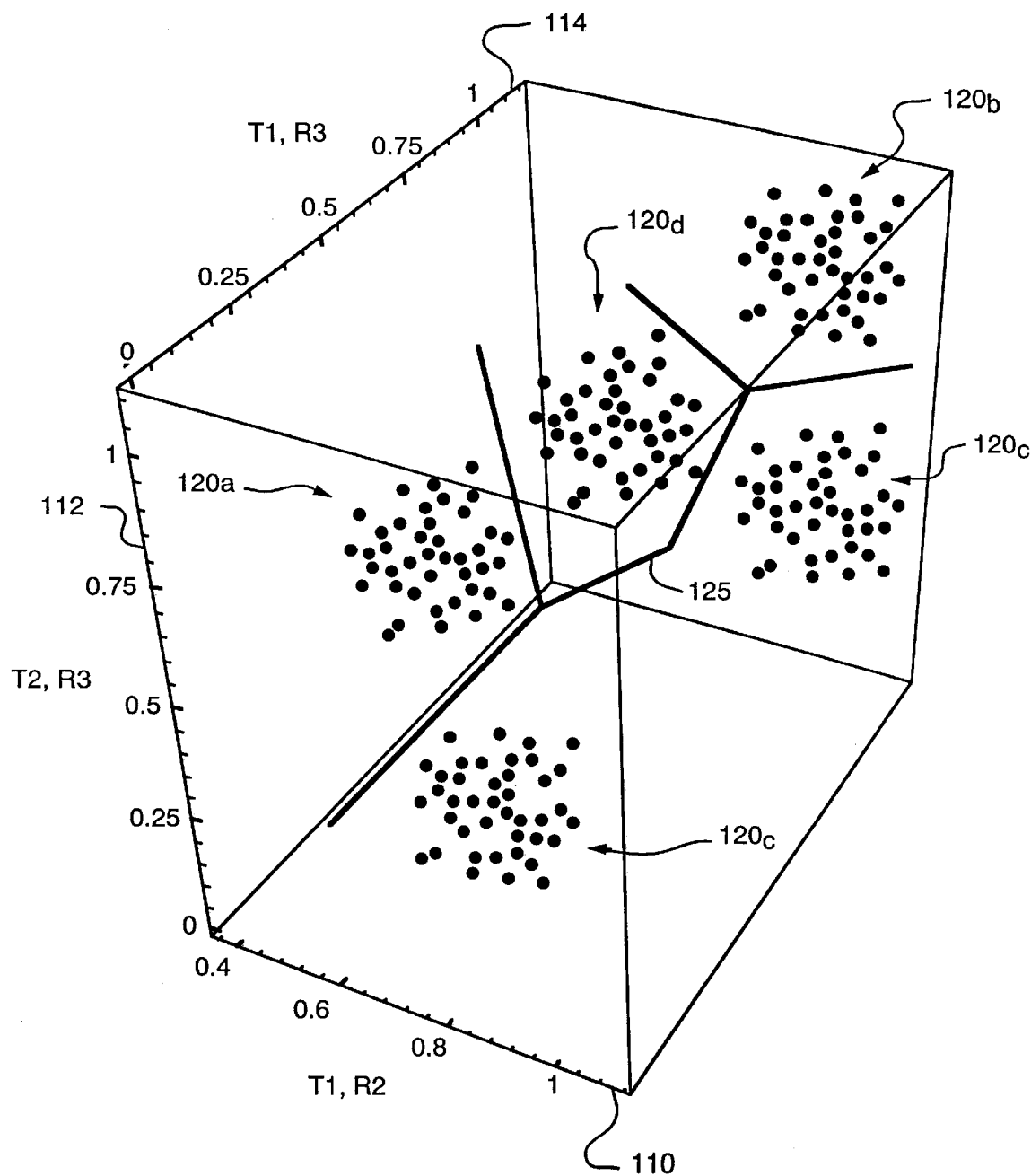
FIG. 5 illustrates the measurement space for three matrix positions and clusters formed by repeated measurements of the various cases illustrated in FIGS. 4A–4E.

These various cases produce measurement clusters that are separable and readily resolved, as illustrated in FIG. 5. For ease of presentation a three-dimensional measurement space is shown, reflecting measurements $m_{21}$, $m_{31}$, $m_{32}$ only; obviously, the 9-dimensional space incorporating all measurements would produce even better results (i.e., greater separability among measurement clusters). A first axis 110 plots $m_{21}$ (transmitter=$E_1$, receiver=$E_2$); a second orthogonal axis 112 plots $m_{31}$ (transmitter=$E_1$, receiver=$E_3$); and a third orthogonal axis 114 plots $m_{32}$ (transmitter=$E_2$, receiver=$E_3$).

Multiple measurements for each of the various cases are represented by points, which cluster as illustrated; each point represents a separate set of $m_{21}$, $m_{31}$, $m_{32}$ measurements, and was generated to simulate an actual case by perturbing a representative measurement point with noise. The cluster $120_a$ corresponds to variations of the measurements shown in table $100_a$, the cluster $120_b$ corresponds to table $100_b$, and so on. The three-dimensional construct 125 depicts the decision boundary between the clusters, which are discrete and well-separated.

In another embodiment, the invention is configured to resolve gestures by plotting redundant measurements separated in time. In other words, what is measured is not only the magnitudes of the transmitted and/or received current, but also their changed values at a different time. The original and "lagged" measurements represent separate parameters for purposes of measurement space.

Figure 6A:
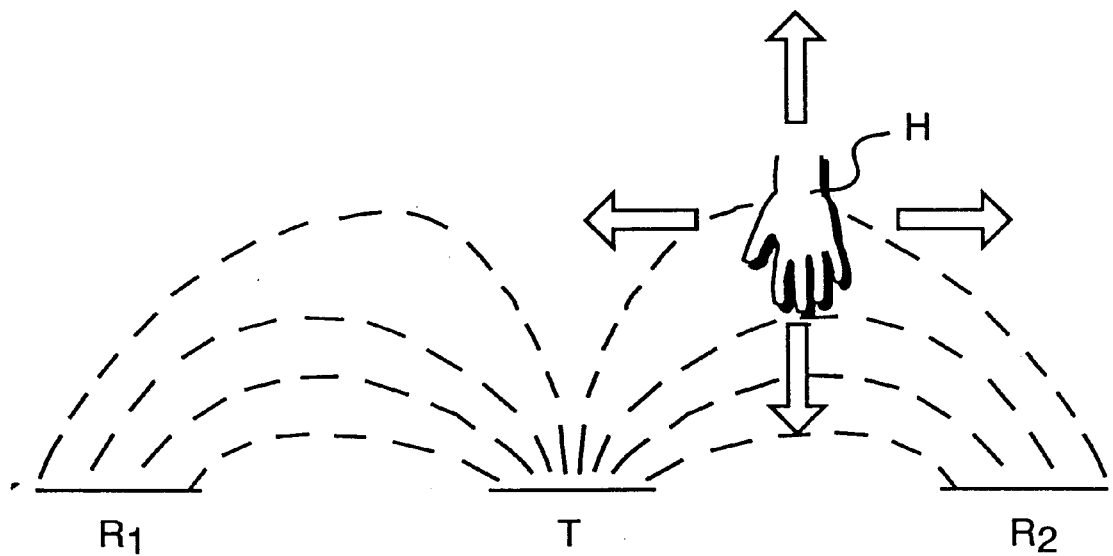
FIG. 6A schematically illustrates a sensor configuration for recognizing gestures.
Figure 6B:
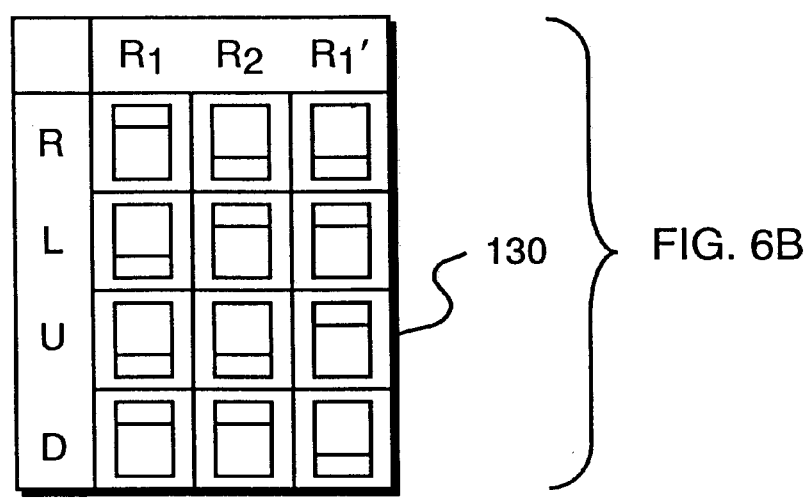
FIG. 6B depicts measurement patterns corresponding to various different gestures as measured by the configuration shown in FIG. 6A.

A representative configuration appears in FIG. 6A, where, for purposes of simplicity, the transmitter T and the receiving electrodes $R_1$, $R_2$ are fixed; this is ordinarily desirable, since the mass to be measured is in motion, but in principle there is no reason why transmitting/receiving identities cannot be exchanged among electrodes. A hand H is free to move left, right, up and down relative to the electrode array, and the measurements taken, as shown in FIG. 6B, include essentially simultaneous measurements at $R_1$ and $R_2$, and a previous or "lagging" measurement $R_1'$. In general, the simultaneous measurements at $R_1$ and $R_2$ are taken periodically, and $R_1'$ is retained in memory 33m from the previous measurement set.

In FIG. 6B, the illustrated position of the hand H is moved (R)ight, (L)eft, (U)p or (D)own from an initial position, and the results graphically depicted in table 130. Leftward movement begins with hand H in the illustrated position; shunt-mode coupling to R, is initially small, as illustrated by the large $R_1'$ measurement, but increases when the hand has moved to a point (not illustrated) between $R_1$ and $R_2$ (as shown by the $R_1$ and $R_2$ measurements). The upward and downward movements assume that the hand is situated over the T electrode.

Figure 7:
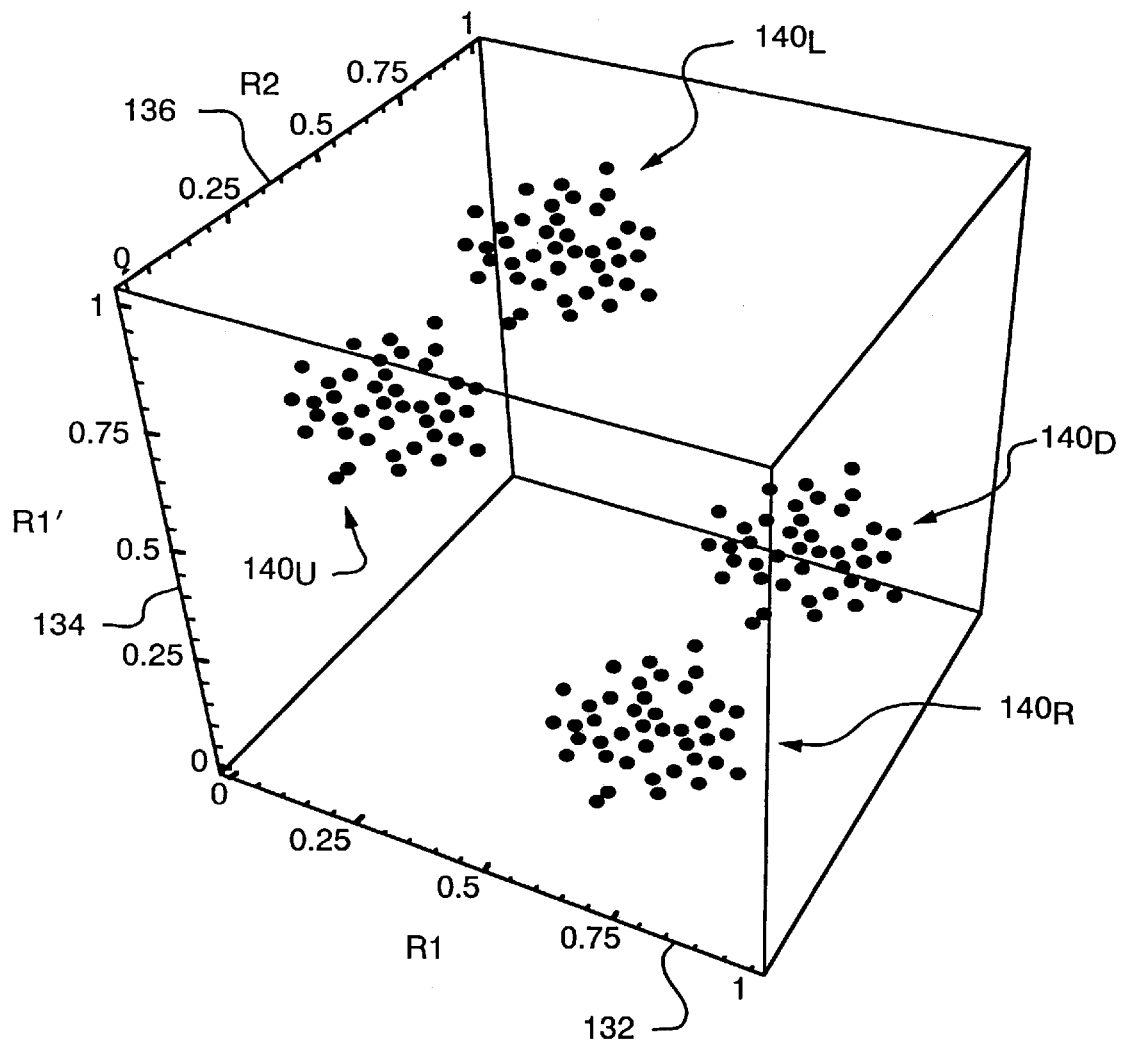
FIG. 7 illustrates the measurement space for the measurement patterns shown in FIG. 6B.

Because the electrodes do not change in function, three measurements are taken for each case, and therefore can be represented by a three-dimensional measurement space as shown in FIG. 7. The space is characterized by orthogonal axes 132 (corresponding to measurements at $R_1$), 134 (corresponding to time-lagged measurements at $R_1$), 136 (corresponding to measurements at $R_2$). Numerous instances of the four cases shown in table 130, each perturbed with noise to simulate slight variations, cluster into four distinct regions corresponding to upward movement (cluster 140$_U$), downward movement (cluster 140$_D$), leftward movement (cluster 140$_L$) and rightward movement (cluster 140$_R$) as described above.

It should be understood that the foregoing configuration is representative only; as few as one electrode (multiple time-separated loading-mode measurements) or two electrodes can resolve numerous movement modes as well.

It will therefore be seen that the foregoing represents a highly extensible and reliable approach to characterizing presence, position and orientation within a defined space. The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. Apparatus for characterizing movement of a mass within a defined space, the apparatus comprising:
   a. at least one electrode proximate to the space;
   b. an AC source;
   c. means for sequentially connecting each of the at least one electrode to the AC source at fixed intervals so as to produce a plurality of electric fields;
   d. means for measuring current flowing from the electrode that is connected to the AC source; and
   e. means for characterizing movement of the mass within the space based on the measurements.

2. The apparatus of claim 1 further comprising:
   a. a computer memory for storing (i) the measurements and (ii) a pattern of measurement clusters each associated with a movement; and
   b. a processor for comparing the measurements against the pattern to thereby characterize movement of the mass.

3. Apparatus for characterizing movement of a mass within a defined space, the apparatus comprising:
   a. at least two electrodes proximate to the space, the electrodes having fixed positions relative to each other;
   b. an AC source;
   c. means for momentarily connecting at least a first electrode to the AC source a plurality of times so as to produce a plurality of electric fields;
   d. means for measuring current flowing into at least one unconnected electrode each time the first electrode is connected to the AC source, thereby producing a plurality of measurements; and
   e. means for characterizing movement of the mass within the space based on the plurality of measurements.

4. The apparatus of claim 3 comprising at least three electrodes, the connecting means being configured to sequentially connect each of the electrodes to the AC source, and the measuring means being configured to make at least two measurements of current flowing into one of the unconnected electrodes and at least one measurement of current into another of the unconnected electrodes.

5. The apparatus of claim 3 comprising at least three electrodes, the connecting means being configured to connect a first of the electrodes to the AC source, and the measuring means being configured to make at least two measurements of current into a second of the electrodes and at least one measurement of current into a third of the electrodes.

6. The apparatus of claim 3 further comprising:
   a. a computer memory for storing (i) the measurements and (ii) a pattern of measurement clusters each associated with a movement; and
   b. a processor for comparing the measurements against the pattern to thereby characterize movement of the mass.

7. A method of characterizing movement of a mass within a defined space, the method comprising the steps of:
   a. providing at least one electrode proximate to the space;
   b. sequentially transmitting an AC signal through the at least one electrode at fixed intervals so as to produce a plurality of discrete electric fields separated in time;
   c. measuring current flowing out of the electrode each time the AC signal is sent; and
   d. characterizing movement of the mass within the space based on the measurements.

8. The method of claim 7 wherein the mass is a person.

9. The method of claim 7 wherein the characterization step comprises the substeps of:
   a. providing a pattern of measurement clusters each associated with a movement; and
   b. comparing the measurements against the pattern to thereby characterize movement.

10. A method of characterizing movement of a mass within a defined space, the method comprising the steps of:
    a. providing at least two electrodes proximate to the space, the electrodes having fixed positions relative to each other;
    b. momentarily transmitting an AC signal through a first electrode a plurality of times so as to produce a plurality of discrete electric fields separated in time;
    c. measuring current flowing into at least one unconnected electrode each time the signal is transmitted by the first electrode, thereby producing a plurality of measurements; and
    d. characterizing movement of the mass within the space based on the plurality of measurements.

11. The method of claim 10 wherein the characterization step comprises the substeps of:
    a. providing a pattern of measurement clusters each associated with a movement; and
    b. comparing the measurements against the pattern to thereby characterize movement.

12. The method of claim 10 wherein the mass is a person.

13. A method of characterizing movement of a mass within a defined space, the method comprising the steps of:
   a. providing at least one electrode proximate to the space;
   b. sequentially transmitting an AC signal through the at least one electrode at fixed intervals so as to produce a plurality of electric fields;
   c. measuring current flowing from the electrode as the AC signal is sent; and
   d. characterizing movement of the mass within the space based on the measurements by (i) providing a pattern of measurement clusters each associated with a movement, (ii) comparing the measurements against the pattern, and (iii) based on the comparison, characterizing the movement.

* * * * *